US007233157B2

(12) United States Patent
Lee et al.

(10) Patent No.: US 7,233,157 B2
(45) Date of Patent: Jun. 19, 2007

(54) TEST BOARD FOR HIGH-FREQUENCY SYSTEM LEVEL TEST

(75) Inventors: Jung-Kuk Lee, Yongin-si (KR); Young-Man Ahn, Yongin-si (KR); Seung-Man Shin, Suwon-si (KR); Jong-Cheol Seo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 106 days.

(21) Appl. No.: 11/025,093

(22) Filed: Dec. 28, 2004

(65) Prior Publication Data

US 2005/0258846 A1      Nov. 24, 2005

(30) Foreign Application Priority Data

May 18, 2004  (KR) ............ 10-2004-0035091

(51) Int. Cl.
*G01R 31/02* (2006.01)
*G01R 31/26* (2006.01)
(52) U.S. Cl. .............. 324/754; 324/758; 324/761; 324/158.1
(58) Field of Classification Search ............. 324/754, 324/761
See application file for complete search history.

(56) References Cited

U.S. PATENT DOCUMENTS 5,136,238 A * 8/1992 Kade ............. 324/761

6,191,597 B1 * 2/2001 Driller et al. ............ 324/758

FOREIGN PATENT DOCUMENTS

JP         11-186700       * 9/1999

OTHER PUBLICATIONS

English language abstract of Korean Publication No. 1999-81438.
English language abstract of Korean Publication No. 2003-64024.
English language abstract of Korean Publication No. 2003-0064024.
English language abstract of Korean Publication No. 2001-0018822.
English language abstract of Japanese Publication No. 5-256904.

* cited by examiner

*Primary Examiner*—Ha Tran Nguyen
*Assistant Examiner*—Emily Y Chan
(74) *Attorney, Agent, or Firm*—Marger Johnson & McCollom, P.C.

(57) ABSTRACT

A test board for a high-frequency system level test: The test board includes a main board having through holes filled with a conductive material. These holes may be located at a portion of the main board from which an existing module socket has been removed. An interface board has surface mounted device (SMD) pads on front and rear surfaces. The SMD pads on the front surface of the interface board are connected with the SMD pads on the rear surface thereof through cross connection wiring within the interface board for a pin swap. The through holes of the main board are connected with the SMD pads on the rear surface of the interface board via iron cores fixed at a guide. A test module socket is mounted on surfaces of the SMD pads on the front surface of the interface board.

20 Claims, 5 Drawing Sheets

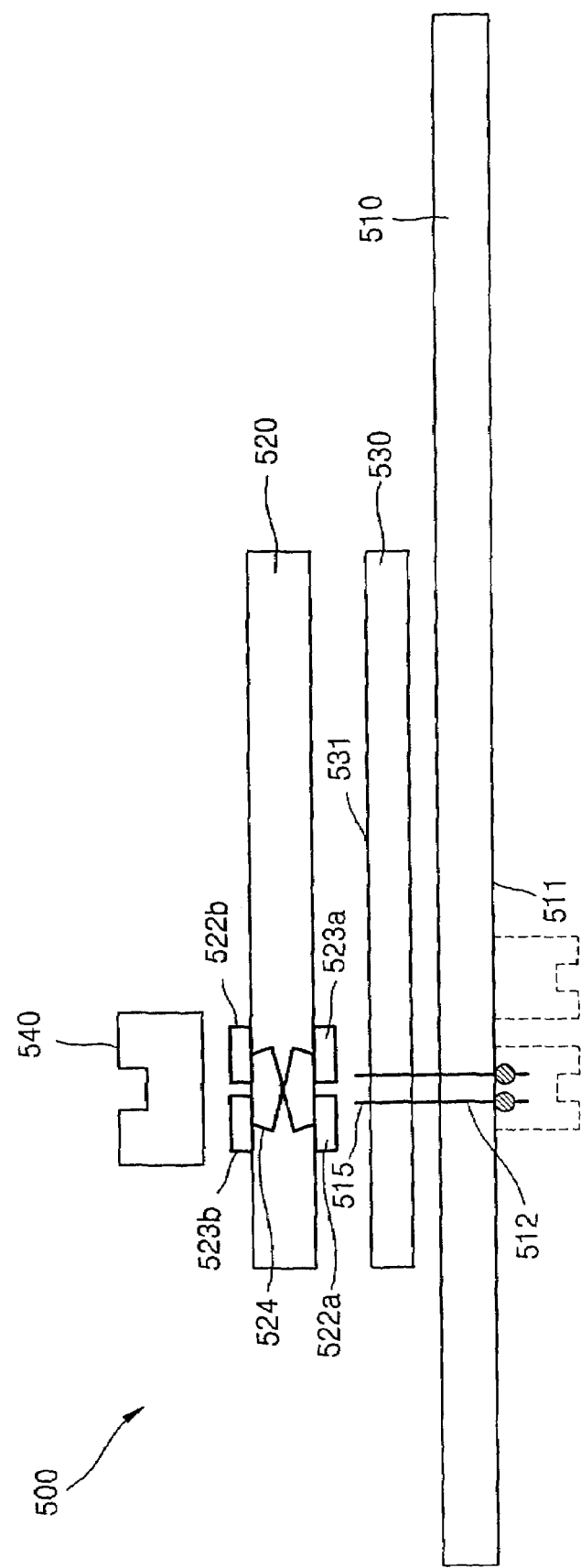

TEST BOARD FOR HIGH-FREQUENCY SYSTEM LEVEL TEST

BACKGROUND OF THE INVENTION

This application claims the priority of Korean Patent Application No. 2004-35091, filed on May 18, 2004, in the Korean Intellectual Property Office. The entire content of Korean Patent Application No. 2004-35091 is hereby incorporated herein by reference.

1. Field of the Invention

The present invention relates to semiconductor device test equipment, and more particularly, to a test board for a system level test in which a semiconductor memory device is tested on the main board of a computer.

2. Description of the Related Art

Generally, after semiconductor memory devices, (such as synchronous dynamic random access memory (SDRAM), Rambus (DRAM), and static RAM (SRAM)) are manufactured, an assembled semiconductor device is inserted into a socket and the device is tested using special test equipment.

Since semiconductor device test equipment is very expensive, the cost for testing semiconductor devices is significant. As a result, the price of semiconductor devices takes into account the cost of testing the devices. In addition, since semiconductor device test equipment tests a semiconductor device on a separate system, and not in the environment in which the semiconductor device is actually installed and used, the tests frequently cannot properly take into account environmental characteristics such as the noise that occurs when devices are on the main board of a computer. This can decrease test accuracy. As a result, problems may occur in the quality of the semiconductor devices.

To solve these problems, frequently, semiconductor devices are tested using a computer main board. With this type of testing, a socket is installed on the main board of a computer. A module or a device to be tested is inserted into the socket, and the computer is operated to monitor whether the module or the device is normal or if it has a defect.

Recently, due to high processing speed, the noise that occurs when devices are used in particular environments has become a significant issue relative to quality. Thus, testing semiconductor devices in an environment in which the devices are actually used, i.e., in an installation environment, is often preferred in contrast to testing semiconductor devices in the relatively silent environment provided by semiconductor device test equipment. A test in the installation environment is performed by inserting a semiconductor memory device into the main board of a personal computer or of a work station similar to the main board in which the semiconductor memory device will actually be used. The computer or the work station is then operated and the operation is monitored to determine if the semiconductor memory device is normal or has if it has a defect.

FIG. 1 illustrates a conventional test board for a system level test in which a semiconductor memory device can be tested in a environment similar to that in which the device will be actually used. Referring to FIG. 1, a test board 100 includes a main board 110 on which a central processing unit (CPU) and other electronic parts are installed. Preexisting module sockets 112 into which semiconductor memory devices would normally be inserted have been removed from a front surface 111 of the main board 110. The main board 110 is positioned upside down. Connectors 114 are installed on the rear surface 113 of the main board 110 and connected with connectors 124 on the rear surface 123 of interface board 120. A plurality of test module sockets 122 are installed on the front surface 121 of the interface board 120. The connectors 124 are connected with the test module sockets 122 via signal lines 125.

Electrical test signals generated in the main board 110 are transmitted to the test module sockets 122 via the connectors 114 and 124 and the signal lines 125. The inside of each test module socket 122 is separated when the test module socket 122 is pressed down using a hand, handler, or other tool so that an external contact, i.e., a lead line, of a semiconductor memory device can be inserted into the test module socket 122. After a test device, i.e., a semiconductor memory device, is put on the test module socket 122, pressure on the top of the test module socket 122 is released, and lead lines on the test device is held by and in contact with the test module socket 122.

As a processing speed of a semiconductor memory device increases, the test board 100 must perform tests at high frequency. However, high-frequency testing is often limited by parasitic resistance (R), inductance (L), and capacitance (C), the value of which depends on the height A between the main board 110 and the interface board 120 and a length B of the signal lines 125.

Therefore, an improved test board capable of reducing the length of the signal lines and capable of performing a high-frequency test is desired.

SUMMARY OF THE INVENTION

The present invention provides a test board for a high-frequency system level test. The test board including a main board that includes through holes filled with a conductive material. These holes may be located in a portion of the board from which an existing module socket has been removed. A guide is disposed to face a surface of the main board. The guide includes stationary iron cores contacting the through holes of the main board. An interface board includes surface mounted device (SMD) pads connected with the iron cores.

Some of the SMD pads may be disposed on a rear surface of the interface board and contact the iron cores, respectively, and the others of the SMD pads may be disposed on a front surface of the interface board. The SMD pads on the rear surface of the interface board may be connected with the SMD pads on the front surface thereof through cross connection wiring within the interface board for a pin swap. The test board may further include a test module socket installed on the SMD pads disposed on the front surface of the interface board.

Each iron core may include an end which protrudes over a front surface of the guide and is folded to form a space into which a highly elastic rubber piece is inserted and another end which protrudes over the surface of the main board from which the existing module socket is removed and is soldered.

According to still another aspect of the present invention, there is provided a test board including a main board that includes through holes filled with pogo pins. A guide is disposed to face a surface of the main board to fix the pogo pins. An interface board includes SMD pads connected with the pogo pins protruding above the guide.

The pogo pins protruding from the surface of the main board may be soldered on the main board.

According to the present invention, conventional connectors that are disposed between a main board and an interface board are removed, and a test module socket is mounted immediately on SMD pads on the interface board.

With the present invention signal lines are greatly shortened. Accordingly, a memory device can be tested at high frequency under the same environment as that under which the memory device is actually used. In addition, system breakage can be reduced, thereby increasing reliability and mass productivity. The test module socket can be easily replaced and repaired since it is installed using surface mount.

BRIEF DESCRIPTION OF THE DRAWINGS

The above and other features and advantages of the present invention will become more apparent by the description of preferred embodiments thereof with reference to the attached drawings in which:

FIG. 5 illustrates a test board for a high-frequency system level test according to a third embodiment of the present invention.

DETAILED DESCRIPTION OF THE INVENTION

Figure 1:
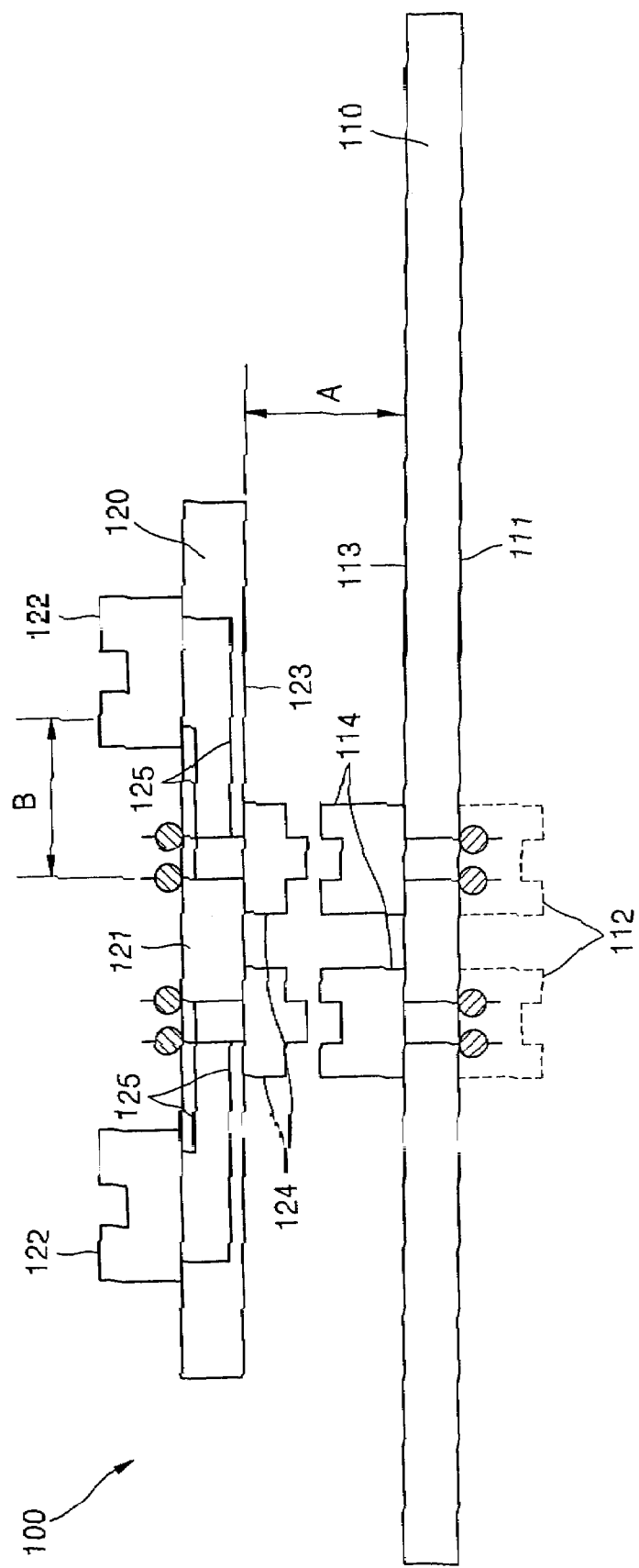
FIG. 1 illustrates a conventional test board for a system level test.

The attached drawings illustrate preferred embodiments of the present invention. The drawings and the following description provide an understanding, the merits, and the objectives accomplished by the present invention.

Hereinafter, the invention will be described in detail by explaining preferred embodiments of the invention with reference to the attached drawings. Like reference numerals in the drawings denote like elements.

Figure 2:
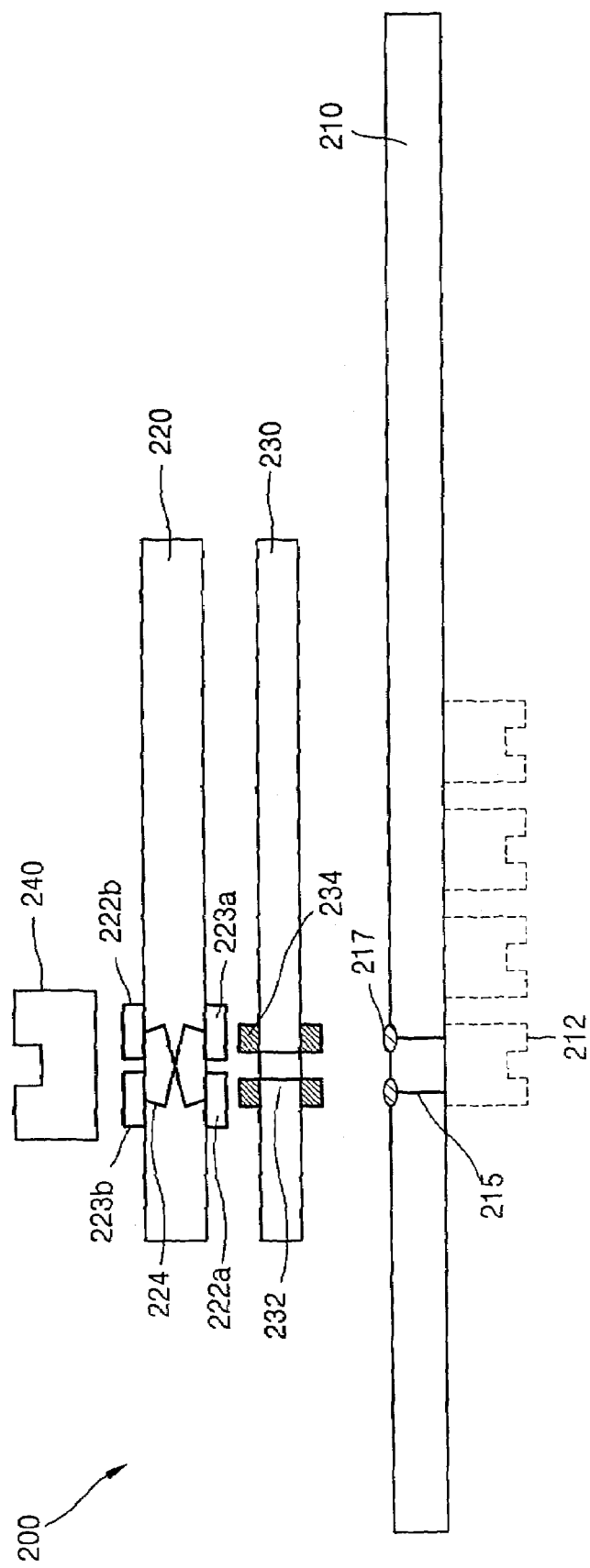
FIG. 2 illustrates a test board for a high-frequency system level test according to a first embodiment of the present invention.

FIG. 2 illustrates a test board 200 according to an embodiment of the present invention. The test board 200 includes a main board 210 and an interface board 220. A guide 230 is positioned between boards 210 and 220 in order to connect the boards to each other.

The main board 210 includes through holes or via holes 215 from which a conventional module socket 212 has been removed. The through holes 215 are formed using a conductive material such as copper (Cu), silver (Ag), or gold (Au). The through holes 215 are soldered, thereby forming contact electrodes 217.

The guide 230 includes iron cores 232 whose ends are folded to form spaces, into which highly elastic rubber pieces 234 are inserted.

Figure 3:
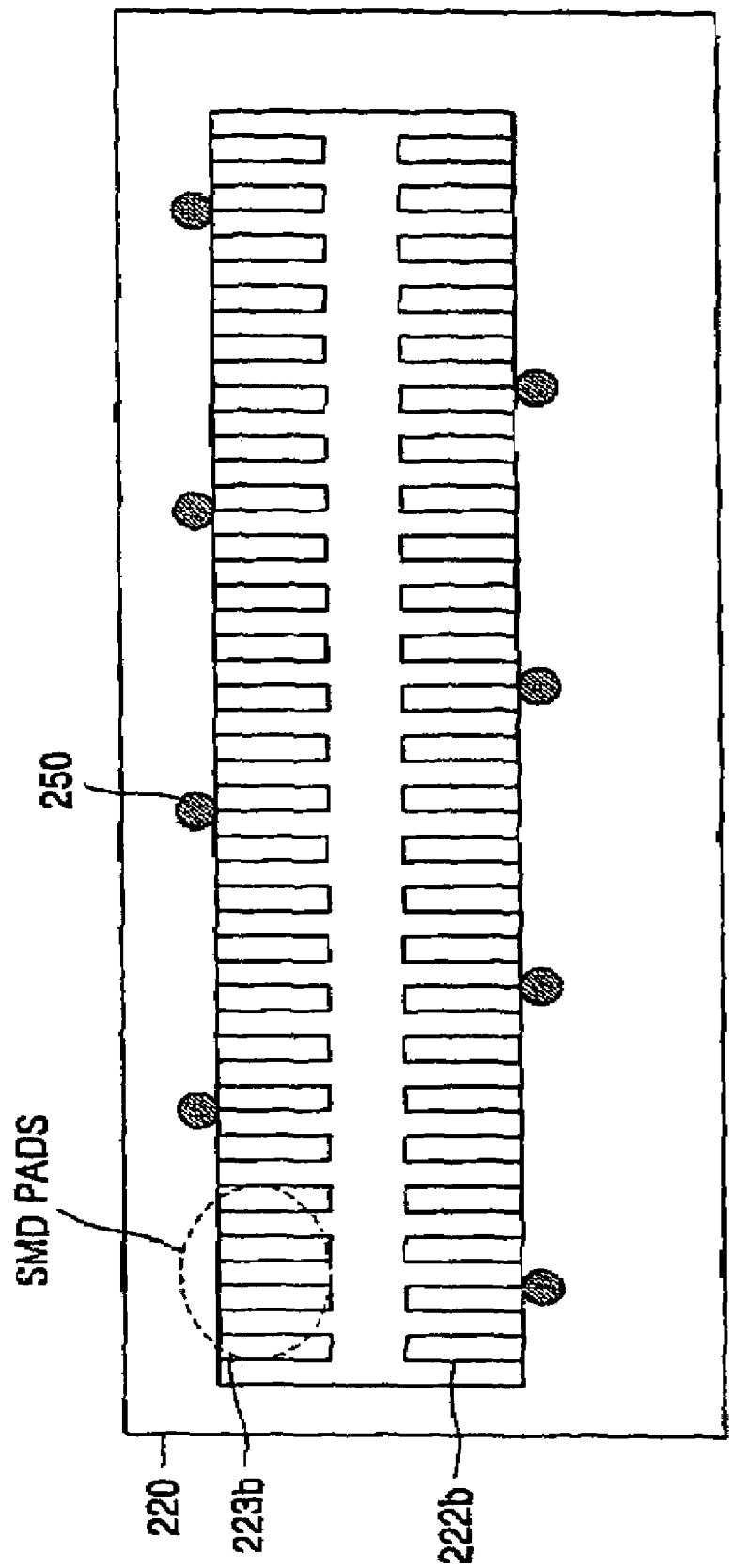
FIG. 3 illustrates a front surface of an interface board shown in FIG. 2.

Surface mounted device (SMD) pads 222a, 222b, 223a, and 223b are formed on both the front and rear surfaces of the interface board 220. Cross connection wiring 224 within the interface board 220 forms a pin swap between the SMD pads 222a and 222b and a pin swap between the SMD pads 223a and 223b. A test module socket 240 is mounted on the SMD pads 222b and 223b on the front surface of the interface board 220, as shown in FIGS. 2 and 3. Since the test module socket 240 is mounted on surfaces of the SMD pads 222b and 223b, it can be easily replaced and repaired.

The iron cores 232, the SMD pads 222a and 223a and the SMD pads 222b and 223b, and the test module socket 240 are positioned above and connected with the contact electrodes 217. The length of the signal line from the contact electrodes 217 to the test module socket 240 is much shorter than a sum of the height A and the length B shown in FIG. 1. Therefore, a semiconductor memory module inserted into the test module socket 240 can be tested at a high speed.

Figure 4:
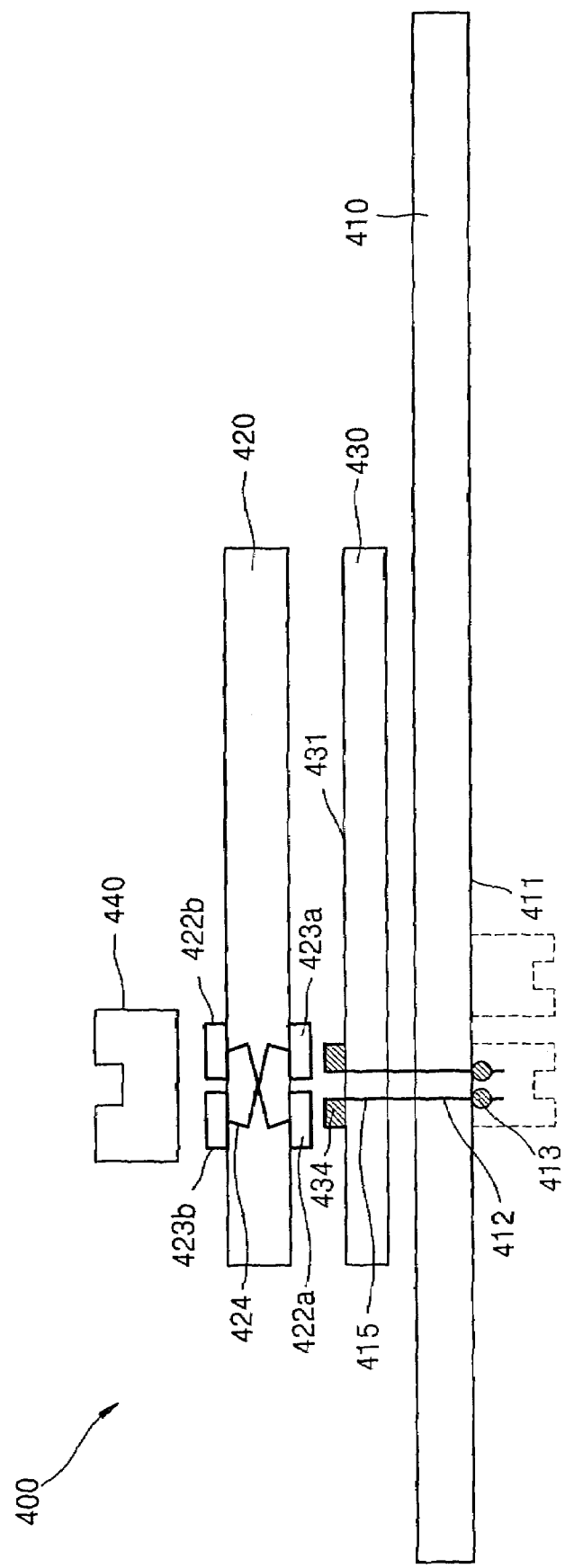
FIG. 4 illustrates a test board for a high-frequency system level test according to a second embodiment of the present invention.

FIG. 4 illustrates a test board 400 according to a second embodiment of the present invention. The test board 400 includes soft iron cores 415 that penetrate through holes 412, respectively, of a main board 410 and a guide 430. The ends of the iron cores 415 that protrude above the front surface 411 of the main board 410 are fixed by solders 413. The other ends of the iron cores 415 that protrude above the front surface 431 of the guide 430 are folded to form spaces, into which high elastic rubber pieces 434 are inserted. SMD pads 422a, 422b, 423a, and 423b are formed on both the rear and front surfaces of the interface board 420. Cross connection wiring 424 is implemented within the interface board 420 for a pin swap between the SMD pads 422a and 422b and for a pin swap between the SMD pads 423a and 423b. A test module socket 440 is mounted on the pads 423b and 422b on the front surface of the interface board 420.

FIG. 5 illustrates a test board 500 according to a third embodiment of the present invention. The test board 500 includes pogo pins 515 that penetrate through holes 512 of the main board 510 and the guide 530. Each pogo pin 515 is a barrel that houses a spring that has cone-shape opposite ends. One ends of the pogo pins 515 that protrudes from the front surface of the main board 510 may be soldered so as to be fixed to the main board 510. The other ends of the pogo pins 515 that protrude from the front surface 531 of the guide 530 may contact SMD pads 522a and 523a. Cross connection wiring 524 within the interface board 520 creates a pin swap between the SMD pads 522a and 522b and a pin swap between the SMD pads 523a and 523b. A test module socket 540 is mounted on the pads 523b and 522b on the front surface of the interface board 520. The pogo pins 515 prevent breakage that might occur due to the pressure created when a test module is pressed and inserted into the test module socket 540. Therefore, the test board 510 according to the third embodiment provides reliability and mass productivity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A test board comprising:
    a main board including through holes filled with a conductive material between a first surface and a second surface thereof;
    iron cores contacting the conductive material within the through holes at the first surface of the main board;
    a guide fixing the iron cores;
    an interface board having one surface on which a plurality of pads connected with the iron cores protruding from the guide are disposed and an opposite surface on which a plurality of pads are disposed; and
    a test module socket mounted on the pads disposed on the opposite surface of the interface board.

2. The test board of claim 1, wherein the pads on the one surface of the interface board are connected with the pads on the opposite surface thereof through cross connection wiring within the interface board to form a pin swap.

3. The test board of claim 1, wherein the test module socket is not mounted at the through holes on the second surfaces of the main board.

4. The test board of claim 1, wherein the iron cores have ends which are folded to form spaces.

5. The test board of claim 4, wherein rubber pieces are inserted into the spaces.

6. The test board of claim 1, wherein the conductive material is one selected from the group consisting of copper, silver, gold, and lead.

7. The test board of claim 1, wherein the pads disposed on the interface board are surface mounted device (SMD) pads.

8. A test board comprising:
a main board including through holes filled with a conductive material between a first surface and a second surface thereof;
iron cores contacting the conductive material within the through holes at the first surface of the main board;
a guide fixing the iron cores;
an interface board having one surface on which a plurality of pads connected with the iron cores protruding from the guide are disposed and an opposite surface on which a plurality of pads are disposed, wherein the pads on the one surface of the interface board are connected with the pads on the opposite surface thereof through cross connection wiring within the interface board to form a pin swap; and
a test module socket mounted on the pads disposed on the opposite surface of the interface board.

9. The test board of claim 8, wherein the iron cores have ends which are folded to form spaces.

10. The test board of claim 8, wherein rubber pieces are inserted into the spaces.

11. The test board of claim 8, wherein the conductive material is one selected from the group consisting of copper, silver, gold, and lead.

12. The test board of claim 8, wherein the pads disposed on the interface board are surface mounted device (SMD) pads.

13. A test board comprising:
a main board, the main board including a first surface and a second surface opposite the first surface, a through hole extending between the first and second surfaces, and a conductive material filling the through hole;
a guide on the first surface of the main board;
a conductive core fixed within the guide, wherein the conductive core is electrically connected to a the main board;
an interface board having one surface on which a first pad is disposed and an opposite surface on which a second pad is disposed, wherein the first pad is electrically connected with the conductive core; and
a second module socket mounted on the second pad.

14. The test board of claim 13, wherein the first pad is connected with the second pad through cross connection wiring within the interface board to form a pin swap.

15. The test board of claim 14, wherein the first and second pads are surface mounted device (SMD) pads.

16. The test board of claim 14, wherein an end of the conductive core extends beyond a surface of the guide and is folded to define a space.

17. The test board of claim 13, wherein a rubber piece is inserted into the space.

18. The test board of claim 14, wherein the conductive core comprises an iron core.

19. The test board of claim 14, wherein the conductive core contacts the conductive material within the through hole.

20. The test board of claim 14, wherein the conductive material is one selected from the group consisting of copper, silver, gold, and lead.

\* \* \* \* \*